United States Patent
Yen et al.

(10) Patent No.: US 11,410,878 B2
(45) Date of Patent: Aug. 9, 2022

(54) SEMICONDUCTOR DEVICE WITH CONTACT PAD AND METHOD OF MAKING

(71) Applicant: TAIWAN SEMICONDUCTOR MANUFACTURING COMPANY, LTD., Hsinchu (TW)

(72) Inventors: Chun-Hsu Yen, Hsinchu (TW); Yu Chuan Hsu, Hsinchu (TW); Chen-Hui Yang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/143,307

(22) Filed: Jan. 7, 2021

(65) Prior Publication Data
US 2021/0125860 A1 Apr. 29, 2021

Related U.S. Application Data

(60) Continuation of application No. 16/748,587, filed on Jan. 21, 2020, now Pat. No. 10,923,391, which is a
(Continued)

(51) Int. Cl.
*H01L 21/768* (2006.01)
*H01L 23/00* (2006.01)
(Continued)

(52) U.S. Cl.
CPC .... *H01L 21/76834* (2013.01); *H01L 21/0217* (2013.01); *H01L 21/02164* (2013.01);
(Continued)

(58) Field of Classification Search
CPC ......... H01L 21/76832; H01L 21/76834; H01L 21/02164; H01L 21/0217; H01L 12/73852;
(Continued)

(56) References Cited

U.S. PATENT DOCUMENTS 5,470,793 A 11/1995 Kalnitsky
5,679,606 A 10/1997 Wang
(Continued)

FOREIGN PATENT DOCUMENTS

CN 1165381 11/1997
CN 1444287 A 9/2003
(Continued)

OTHER PUBLICATIONS

Office Action dated Sep. 13, 2021 for corresponding case No. CN 201711039533.0 (pp. 1-12).
(Continued)

*Primary Examiner* — Jose R Diaz
(74) *Attorney, Agent, or Firm* — Hauptman Ham, LLP

(57) ABSTRACT

A semiconductor structure includes a conductive structure over a first passivation layer; and a second passivation layer over the conductive structure and the first passivation layer. The second passivation layer has a first oxide film extending along a top surface of the first passivation layer, sidewalls and a top surface of the conductive structure, wherein a top surface of the first oxide film is planar. The second passivation layer further includes a second oxide film over a top surface of the first oxide film and a top surface of the conductive structure, wherein a top surface of the second oxide film is planar. The second passivation layer further includes a third oxide film extending along a top surface of the second oxide film, the sidewalls and the top surface of the conductive structure, wherein a top surface of the third oxide film is curved.

20 Claims, 4 Drawing Sheets

Related U.S. Application Data division of application No. 15/701,654, filed on Sep. 12, 2017, now Pat. No. 10,553,479.

(60) Provisional application No. 62/459,936, filed on Feb. 16, 2017.

(51) Int. Cl.
*H01L 23/532* (2006.01)
*H01L 21/02* (2006.01)

(52) U.S. Cl.
CPC .. *H01L 21/76832* (2013.01); *H01L 21/76852* (2013.01); *H01L 23/5329* (2013.01); *H01L 23/53295* (2013.01); *H01L 24/03* (2013.01); *H01L 24/05* (2013.01); *H01L 2224/02206* (2013.01); *H01L 2224/02215* (2013.01); *H01L 2224/0391* (2013.01); *H01L 2224/0401* (2013.01); *H01L 2924/14* (2013.01); *H01L 2924/35121* (2013.01); *H01L 2924/37001* (2013.01)

(58) Field of Classification Search
CPC ........... H01L 23/53295; H01L 23/5329; H01L 24/03; H01L 24/05; H01L 2224/0401; H01L 2924/14
See application file for complete search history.

(56) References Cited

U.S. PATENT DOCUMENTS

| | | | |
|---|---|---|---|
| 6,124,640 A | 9/2000 | Sahota | |
| 6,166,427 A | 12/2000 | Huang | |
| 6,211,570 B1 | 4/2001 | Kakamu | |
| 6,372,670 B1 | 4/2002 | Maeda | |
| 6,437,441 B1 | 8/2002 | Yamamoto | |
| 6,472,307 B1 | 10/2002 | Dennis | |
| 7,052,997 B2 * | 5/2006 | Sandhu | H01L 21/31625 |
| | | | 438/758 |
| 10,553,479 B2 * | 2/2020 | Yen | H01L 23/5329 |
| 10,923,391 B2 * | 2/2021 | Yen | H01L 23/53295 |

FOREIGN PATENT DOCUMENTS

| | | |
|---|---|---|
| CN | 1612306 A | 5/2005 |
| CN | 102354684 A | 2/2012 |
| TW | 301790 | 4/1997 |
| TW | 314643 | 9/1997 |
| TW | 152923 | 9/2001 |
| TW | 200620534 | 6/2006 |

OTHER PUBLICATIONS

Office Action dated Jul. 22, 2020 from corresponding application No. TW 106137206.
Lia et al., FTIR Study of Adsorption and Photoassisted Oxygen Isotopic Exchange of Carbon Monoxide, Carbon Dioxide, Carbonate, and Formate on TiO2 al., J Phys. Chem. B 2002, 106, 11240-11245 (Year 2002).

* cited by examiner

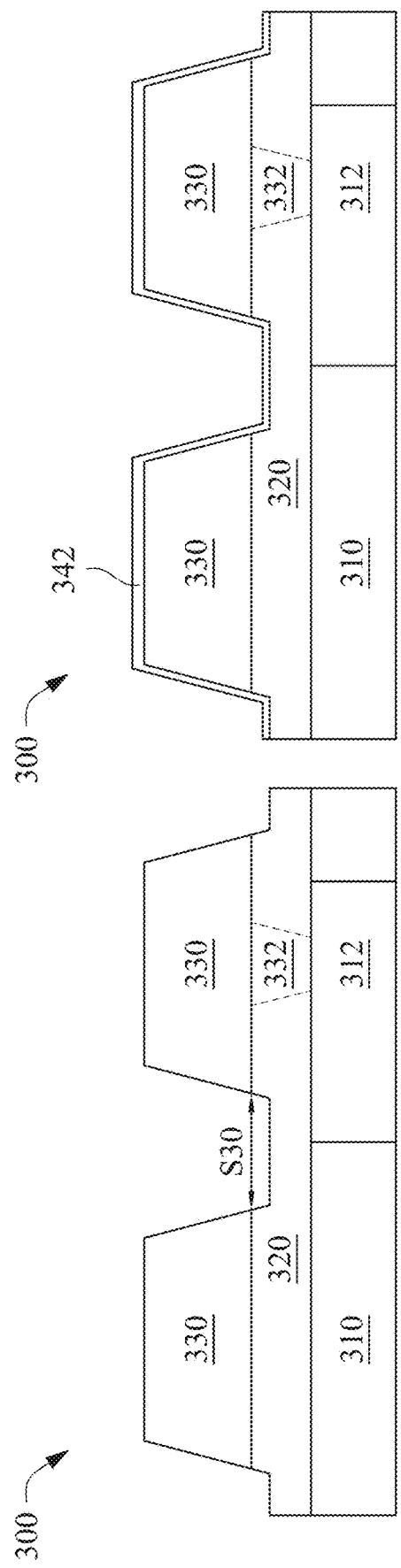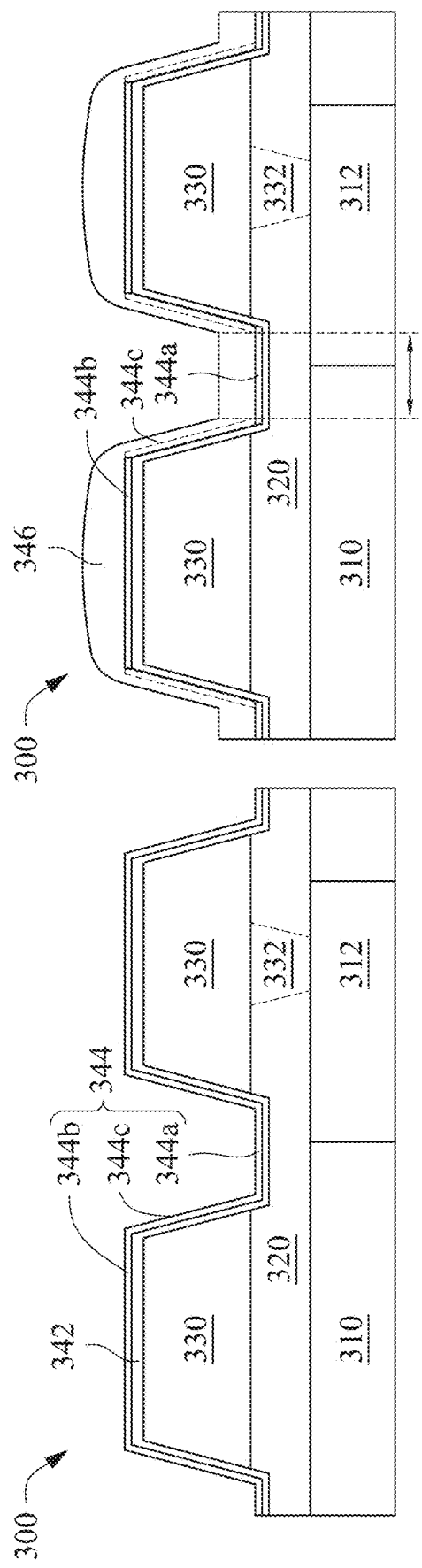

SEMICONDUCTOR DEVICE WITH CONTACT PAD AND METHOD OF MAKING

RELATED APPLICATION

This application is a continuation from U.S. application Ser. No. 16/748,587, filed Jan. 21, 2020, which is a divisional application from U.S. patent application Ser. No. 15/701,654, filed Sep. 12, 2017, now U.S. Pat. No. 10,553,479, issued Feb. 4, 2020, which claims the benefit of U.S. Provisional Application No. 62/459,936, filed Feb. 16, 2017, the entirety of which are incorporated herein by reference.

BACKGROUND

After completion of the fabrication process of an integrated circuit (IC) device, contact pads are formed over a topmost inter metal dielectric (IMD) and for use in wire bonding or flip-chip bonding. In a flip-chip scale packaging process, a conductive bump is formed to establish an electrical connection between a contact pad and a substrate or a lead frame of the package. In order to fulfill market demands toward increased functionality and decreased manufacturing cost, a wafer-level chip scale packaging (WLCSP) process is introduced by forming a post passivation interconnect (PPI) and/or an under bump metallurgy (UBM) structure over the contact pad. The wafer is sawed into dies to be bonded to a printed circuit board (PCB), in some instances.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D are cross-sectional views of a semiconductor device at various stages of manufacturing in accordance with one or more embodiments.

DETAILED DESCRIPTION

Figure 1:
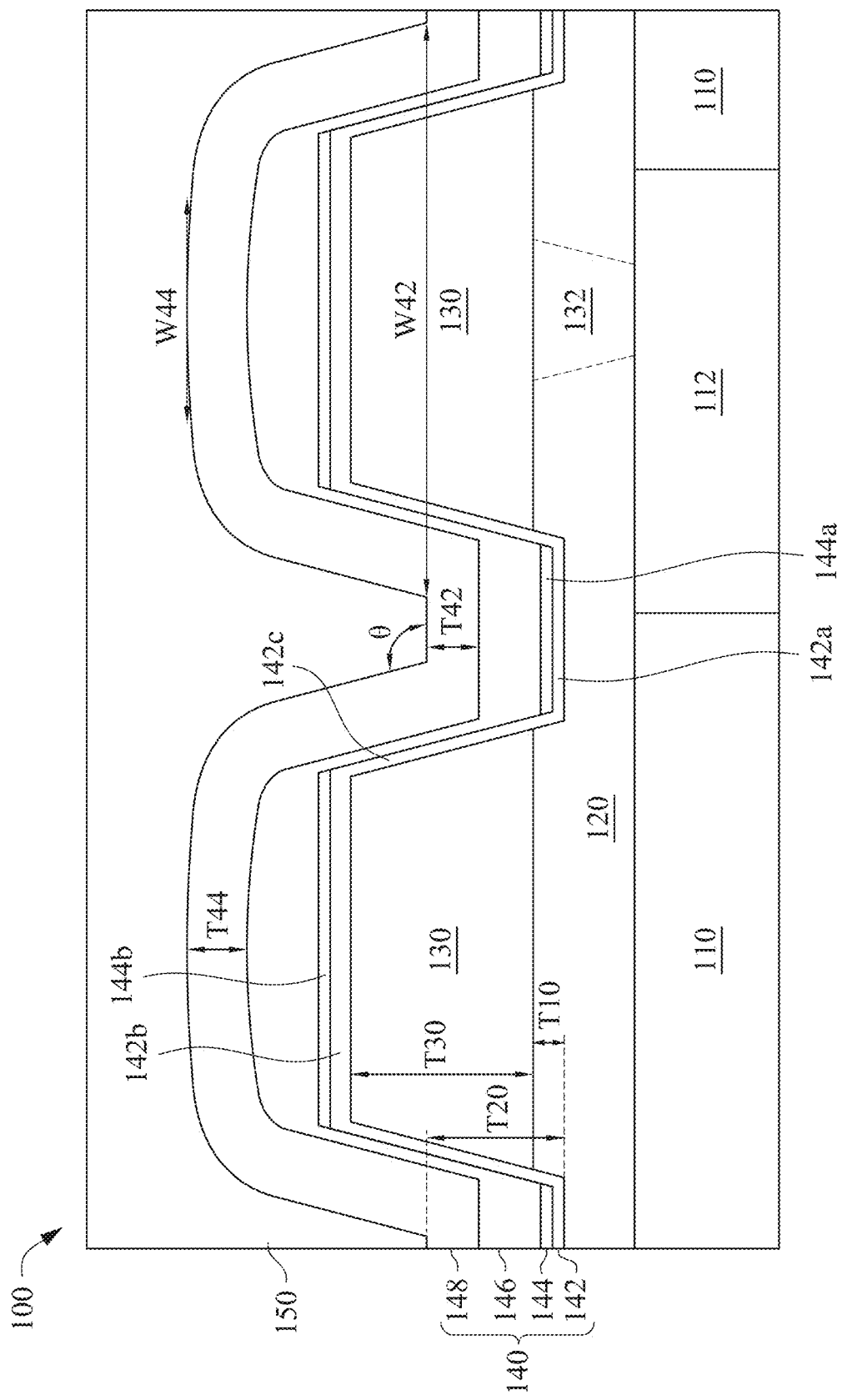
FIG. 1 is a cross-sectional view of a semiconductor device in accordance with one or more embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

An integrated circuit (IC) structure includes semiconductor dies having active components, such as transistors and diodes, and passive components, such as capacitors and resistors, which are initially isolated from each other and later electrically coupled to each other and/or to another IC structure through interconnect structures to create functional circuits. A first passivation layer is formed over the interconnect structures to protect the interconnect structures from being damaged. A plurality of contact pads are formed over the first passivation layer and are covered by a second passivation layer to protect the contact pads. One or more stress buffer layers for reducing a stress mismatch introduced during a packaging process are deposited over the second passivation layer.

In some embodiments, the second passivation layer includes at least four insulating films sequentially formed on a top surface of the contact pad. A second insulating film is discontinuously arranged between a first insulating film and a third insulating film. In some embodiments where the contact pad has a trapezoid profile and a top portion has a smaller width than a bottom portion, the second passivation layer is along the trapezoid profile of the contact pad. In such a way, a space between adjacent contact pads is free of voids because the second passivation layer is free of an overhang extending outwardly from the top portion of the contact pad. As a result, the first passivation layer is protected from an acid solution used during a subsequent manufacturing process. In comparison with other approaches, the second passivation layer helps to reduce defects such as stress cracking and/or peeling at a bottom portion of the contact pad, thereby improving a device reliability and production yield.

FIG. 1 is a cross-sectional view of a semiconductor device 100 in accordance with one or more embodiments. Semiconductor device 100 includes an inter-metal dielectric (IMD) 110, a first passivation layer 120, at least one contact pad 130, and a second passivation layer 140. IMD 110 is a topmost layer of multiple IMD layers that are stacked over a substrate. IMD 110 is configured to physically and electrically isolate one interconnect structure, such as a conductive line or a via plug, from another interconnect structure. In some embodiments, IMD 110 includes silicon oxide ($SiO_x$; x is equal to or smaller than 2). In some embodiments, IMD 110 includes a low dielectric constant κ (low-κ) dielectric (as compared to silicon dioxide), such as phophosilicate glass (PSG), borosilicate glass (BSG), borophosphosilicate glass (BPSG), fluorinated silicate glass (FSG), silicon oxycarbide ($SiO_xC_y$), tetraethyl orthosilicate (TEOS), a combination thereof or another suitable material. A topmost conductive line 112 is in IMD 110. In some embodiments, conductive line 112 is connected to an active device or a part of a passive device. In some embodiments, conductive line 112 is a part of a dummy pattern or a guard seal ring structure. In some embodiments, conductive line 112 includes copper, aluminum, tungsten, titanium, a combination thereof or another suitable material.

First passivation layer 120 is over IMD 110 and is below contact pads 130 and second passivation layer 140. That is, a first portion of first passivation layer 120 is in direct contact with contact pads 130 and a second portion of first passivation layer 120 is in direct contact with second passivation layer 140. In some embodiments, a thickness T10 between a top surface of the first portion and a top surface of the second portion is in a range from about 100 nanometers (nm) to about 300 nm. A greater difference increases a difficulty of filling a space between adjacent contact pads 130, in some instances. In some embodiments, first passivation layer 120 is configured to protect the interconnect structures from damage and contamination. In some embodiments, first passivation layer 120 further provides protection to help prevent or decrease moisture, mechanical and radiation damage to the underlying electrical devices. In some embodiments, a thickness of first passivation layer 120 ranges from about 500 nm to about 1200 nm. A thicker first passivation layer 120 increases manufacturing cost without significant benefit, in some instances. A thinner first passivation layer 120 provides insufficient protection to the underlying structures, in some instances. In some embodiments, first passivation layer 120 includes a dielectric material, such as silicon oxide, undoped silicate glass (USG), silicon nitride, silicon oxynitride, polymer, a combination thereof or another suitable material. In some embodiments, first passivation layer 120 includes a single material. In some embodiments, first passivation layer 120 includes a plurality of materials.

Contact pad 130, also referred to as a bonding pad or an input/output (I/O) pad, is over first passivation layer 120. In some embodiments, a via plug 132 is in first passivation layer 120 and is configured to electrically connect contact pad 130 and conductive line 112. In some embodiments, via plug 132 is a portion of contact pad 130. That is, a bottom portion of contact pad 130 extends through first passivation layer 120 and an upper portion of contact pad 130 extends over first passivation layer 120. In some embodiments, contact pad 130 includes aluminum, copper, aluminum alloys, copper alloys, a combination thereof or another suitable conductive material. In some embodiments, contact pad 130 includes a same material as conductive line 112. In some embodiments, contact pad 130 includes a different material from conductive line 112.

Second passivation layer 140 is over contact pads 130 and first passivation layer 120 so as to protect contact pads 130 from damage. In some embodiments, second passivation layer 140 is configured to absorb or release thermal stress and/or mechanical stress caused during dicing and packaging processes. Second passivation layer 140 includes a first insulating film 142, a second insulating film 144, a third insulating film 146 and a fourth insulating film 148. In various embodiments, first insulating film 142 is configured to protect contact pad 130 from being damaged by a high-density plasma. In various embodiments, second insulating film 144 is configured to provide a physical isolation of first insulating film 142, preventing atoms from diffusing into contact pad 130. In various embodiments, third insulating film 146 is configured to form a trapezoid profile of second passivation layer 140, thereby helping to prevent a formation of overhangs and/or voids.

First insulating film 142 includes a first portion 142a in direct contact with first passivation layer 120, a second portion 142b in direct contact with a top surface of contact pad 130, and a third portion 142c in direct contact with sidewalls of contact pad 130. Second insulating film 144 includes a first portion 144a over and in contact with first portion 142a, and a second portion 144b over and in contact with second portion 142b. In some embodiments, an entirety of second insulating film 144 is substantially parallel with the top surface of first passivation layer 120. Third insulating film 146 is over first portion 144a, second portion 142b, and third portion 142c. In other words, except for sidewall portions of contact pad 130, second insulating film 144 is between first insulating film 142 and third insulating film 146. At the sidewall portions of contact pad 130, third insulating film 146 is in direct contact with first insulating film 142. Fourth insulating film 148 is continuously in direct contact with third insulating film 146 and is below a relatively soft film 150 functioning as a stress buffer. In some embodiments, relatively soft film includes at least one of polyimide (PI), benzocyclobutene (BCB), polybenzoxazole (PBO), epoxy, silicone, acrylates, nano-filled phenolic resin or other suitable material. In some embodiments, fourth insulating film 148 has a bottom-up ratio, i.e., a ratio of thickness T44 to thickness T42, ranging from about 0.75 to about 1.1. In some embodiments, each insulating film of second passivation layer 140 includes silicon oxide, silicon nitride, silicon oxynitride or another suitable material. In some embodiments, at least one insulating film of second passivation layer 140 includes a same material as first passivation layer 120. In some embodiments where adjacent insulating films 142-146 include a same material, due to different film densities, an interface exists to separate one insulating film from another with respect to a cross-sectional view. In some embodiments, the interface is formed by different deposition processes. In some embodiments, each insulating film of second passivation layer 140 includes a different material from first passivation layer 120. In at least one embodiment, first, second and third insulating films 142-146 include silicon oxide and fourth insulating film 148 includes silicon nitride. In some embodiments, an angle θ between a sidewall portion and a bottom portion of fourth insulating film is greater than 95 degrees. A smaller angle increases a difficulty of a subsequent process, for example, a filling of a polymeric layer, in some instances.

In some embodiments where first, second and third insulating films 142-146 include silicon oxide, a refractive index of second insulating film 144 is from about 8% to about 15% greater than that of first insulating film 142. In some embodiments, the refractive index of second insulating film 144 is greater than that of third insulating film 146. In some embodiments, the refractive index of second insulating film 144 ranges from about 1.6 to about 1.7. A smaller refractive index increases a breakdown voltage variation resulting from a subsequent plasma processing, in some instances. In some embodiments, the refractive index of second insulating film 144 ranges from about 1.7 to about 1.8. In some embodiments where first insulating film 142 and third insulating film 146 include silicon oxide, the refractive index of first insulating film 142 and/or third insulating film 146 independently ranges from about 1.4 to about 1.5. A greater or a smaller refractive index changes a profile of semiconductor device 100, in some instances. In some embodiments, first insulating film 142 has a same refractive index as third insulating film 146. In some embodiments, first insulating film 142 has a different refractive index from third insulating film 146. For example, in some embodiments, the refractive index of first insulating film 142 is smaller than that of third insulating film 146.

In some embodiments where first, second and third insulating films 142-146 include silicon oxide, in order to have a relatively high refractive index comparing to first and third insulating films 142 and 146, second insulating film 144 has a smaller oxygen-to-silicon ratio than that of first insulating film 142 or third insulating film 146. In some embodiments, second insulating film 144 has a greater dielectric constant than that of first insulating film 142 or third insulating film 146. Because silicon atoms constitute larger vacant space than oxygen atoms, a dielectric constant is inversely proportional to oxygen-to-silicon ratio. In some embodiments where second and third insulating films 144-146 include silicon oxide, at least one of second insulating film 144 or third insulating film 146 has a Fourier transform infrared spectroscopy (FTIR) absorption band ranging from about 2500 nm to about 2900 nm. In some embodiments, first, second and third insulating films 142-146 have a FTIR absorption band independently ranging from about 8000 nm to about 13333 nm.

Second passivation layer 140 has a thickness T20 measured from the top surface of first passivation layer 120. In some embodiments, a ratio of thickness T20 to a thickness T30 of contact pad 130 is in a range from about 0.7 to about 1.3. A greater ratio increases a difficulty of filling the space between adjacent contact pads 130, in some instances. A smaller ratio provides insufficient protection to contact pads 130, in some instances. A maximum distance T42 between sidewalls of second passivation layer 140 is measured from a top surface of fourth insulating film 148, and a W44 of a planar portion of second passivation layer 140 is measured at a top portion of fourth insulating film 148. In some embodiments, a ratio of width W42 to width W44 is in a range from about 3:1 to about 4:1. A smaller ratio increases an occurrence of overhangs at an upper corner of contact pad 130, in some instances.

Figure 2:
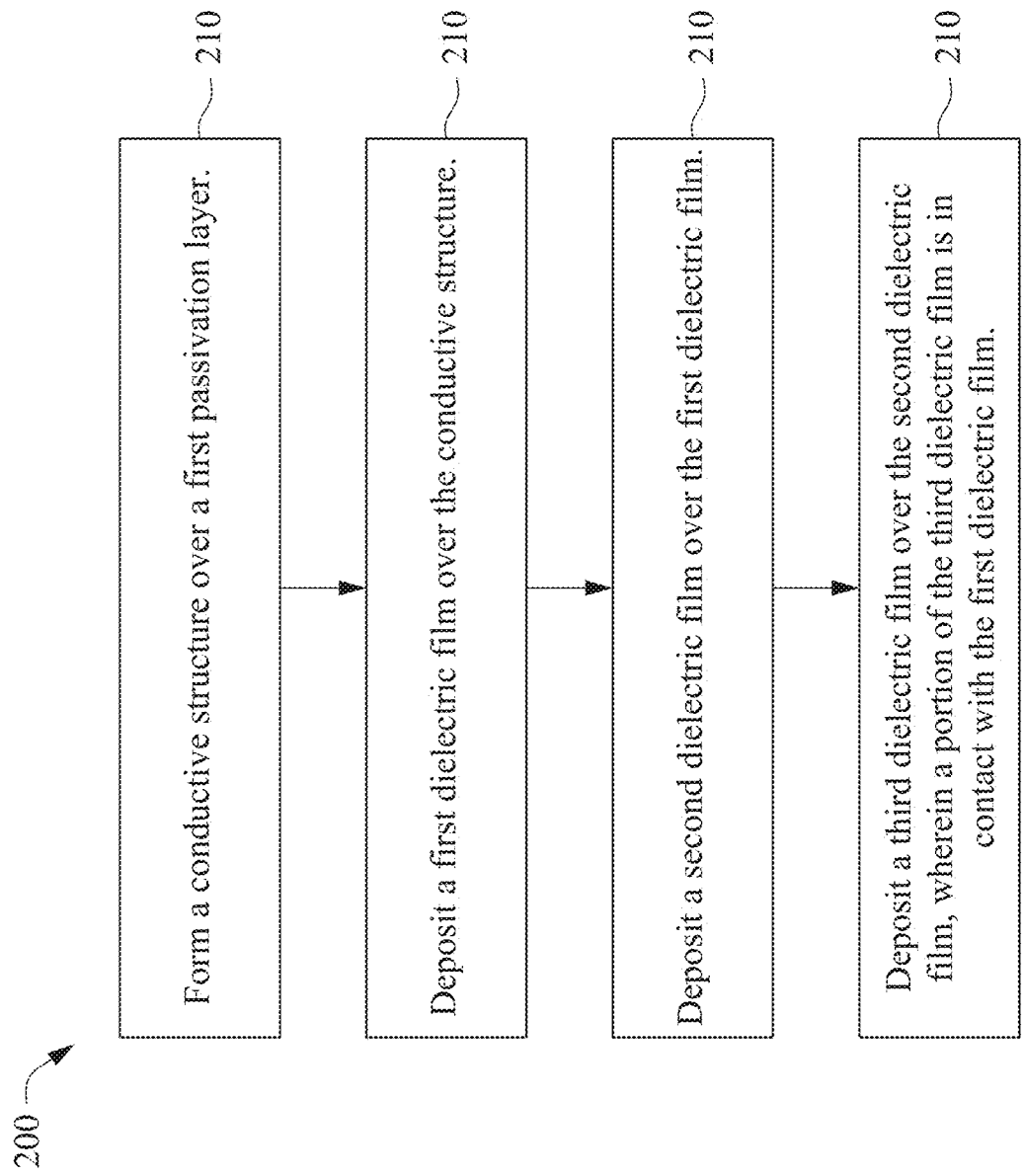
FIG. 2 is a flow chart of a method of fabricating a semiconductor device in accordance with one or more embodiments.

FIG. 2 is a flow chart of a method 200 of fabricating a semiconductor device in accordance with one or more embodiments. One of ordinary skill in the art would understand that additional operations are able to be performed before, during, and/or after method 200 depicted in FIG. 2. Additional details of the fabrication process are provided below with respect to FIGS. 3A-3D and 4, in accordance with some embodiments.

Method 200 includes operation 210 in which a conductive structure, e.g., contact pad 130 in FIG. 1, is formed over a first passivation layer, e.g., first passivation layer 120 in FIG. 1. In some embodiments, the first passivation layer is deposited over a topmost IMD and a topmost conductive line, which are stacked over a substrate to form an interconnect structure. In some embodiments, a thickness of the first passivation layer ranges from about 500 nm to about 1200 nm. A thicker first passivation layer increases manufacturing cost without significant benefit, in some instances. A thinner first passivation layer provides insufficient protection to the underlying interconnect structure, in some instances. In some embodiments, a liner is formed prior to the deposition of the first passivation layer and serves as an etch stop layer in order to provide an etch selectivity.

A portion of the first passivation layer is removed using a lithography process and an etch process to form at least one opening exposing the topmost conductive line. The etch process includes a wet etching using a chemical etchant, or a dry etching by exposing the first passivation layer to a bombardment of ions. After the opening is formed in the first passivation layer, a conductive material, such as aluminum, aluminum alloy, copper, or copper alloy, is deposited over the first passivation layer, filling the opening to electrically connect to the topmost conductive line. The deposition of the conductive material includes sputtering, physical vapor deposition (PVD), chemical vapor deposition (CVD), atomic layer deposition (ALD), electrolytic plating, electroless plating or another suitable process. In some embodiments, the conductive material is deposited to a thickness ranging from about 1000 nm to about 3000 nm. A greater thickness increases manufacturing cost without a significant improvement for electrical performance, in some instances. A smaller thickness provides insufficient support for a stress caused during a wiring process, in some instances. In some embodiments where the thickness of the conductive material is smaller than a depth of the opening, a center portion of the conductive structure protrudes toward the first passivation layer, resulting in a recess at the top surface of the conductive structure. In some embodiments, a planarization process, such as chemical mechanical polishing (CMP) is performed after the deposition of the conductive material so that the top surface of the conductive structure is substantially planar. Next, the conductive layer is patterned and etched to form the conductive structure, which corresponds to the opening formed through the first passivation layer. The etch process includes a wet etching and a dry etch, such as a plasma-enhanced etch process. In some embodiments, the conductive structure has a circular shape, an octagonal shape, a rectangular shape or another suitable shape with respect to a top view.

Method 200 includes operation 220 in which a first dielectric film, e.g., first insulating film 142 in FIG. 1, is deposited over the conductive structure. In at least one embodiment, the first dielectric film is continuously and conformally deposited along the top surface of first passivation layer, and sidewalls and the top surface of the conductive structure. In some embodiments, the deposition of the first dielectric film includes CVD, such as plasma-enhanced CVD (PECVD), low pressure CVD (LPCVD) or another suitable process. In some embodiments, the deposition of the first dielectric film includes an ALD or a high aspect ratio process (HARP).

Method 200 includes operation 230 in which a second dielectric film, e.g., second insulating film 144 in FIG. 1, is deposited over the first dielectric film. In some embodiments, the second dielectric film includes undoped silicate glass (USG). The deposition of the second dielectric film includes CVD, such as high density plasma CVD (HDPCVD), PECVD or another suitable process. In some embodiments where the second dielectric film includes silicon oxide, a silicon-to-oxygen ratio of the second dielectric film is greater than that of the first dielectric film. Thus, during the deposition, a ratio of the usage of a silicon source, such as silane, disilane, trisilane or dichlorosilane, to the usage of an oxygen source, such as oxygen or nitrous oxide, is sufficient to result in a refractive index in a range from about 1.6 to about 1.8. In some embodiments, the second dielectric film helps to prevent diffusion of silicon atoms toward the conductive structure during a subsequent process. In some embodiments, the second dielectric film provides an etch selectivity or a selective endurance under an ion bombardment so as to realize a trapezoid profile of the semiconductor device.

Method 200 includes operation 240 in which a third dielectric film, e.g., third insulating film 146 in FIG. 1, is deposited over the second dielectric film. The deposition includes HDPCVD, PECVD or another suitable process. By using HDPCVD, the third dielectric film is denser than the first dielectric film, reducing a stress spreading over the first passivation and fewer defects. In some embodiments, HDPCVD that uses an electron cyclotron resonance (ECR) technique or an induced coupling plasma (ICP) technique provides the ion bombardment with a radio frequency (RF) bias that removes a portion of the second dielectric film during the deposition of the third dielectric film. In some embodiments where the third dielectric film includes silicon oxide, HDPCVD uses silane as a silicon precursor and oxygen as an oxygen precursor. Inert gas such as argon is added in the process to enhance a sputtering etch effect. In some embodiments, a portion of the second dielectric film lying along sidewalls of the conductive structure is removed during the deposition of the third dielectric film. As a result, a portion of the third dielectric film is in contact with the first dielectric film. In at least one embodiment, the third dielectric film is deposited using a same method as that used for the second dielectric film. However, even though the third dielectric film and the second dielectric film are deposited in a same chamber and have a same material, an interface exists between the two films with respect to a cross-sectional view. By removing a portion of the second dielectric film, a combination of the second passivation layer lies along a shape of the conductive structure, thereby reducing a risk of forming overhangs that extend outwardly from an upper corner of the second passivation layer. A space between adjacent conductive pads has fewer pinholes than a semiconductor device manufactured by other approaches.

In some embodiments, additional operations are included in method 200, for example a fourth dielectric film is deposited over the third dielectric film. As another example, the fourth dielectric film is patterned and the second passivation layer is etched to form an opening to expose a center portion of the conductive structure so as to couple to a redistribution line.

FIGS. 3A-3D are cross-sectional views of a semiconductor device 300 at various stages of manufacturing in accordance with one or more embodiments. Semiconductor device 300 includes elements similar to semiconductor device 100 and a last two digits of like elements are the same. FIG. 3A is a cross-sectional view of semiconductor device 300 following operation 210 in accordance with some embodiments. Semiconductor device 300 includes an IMD 310, a conductive line 312, a first passivation layer 320, a plurality of contact pads 330 and a via plug 332. In some embodiments, a conductive material is blanket formed over a top surface of first passivation layer 320. A lithography process and an etch process are subsequently performed to form contact pads 330. In some embodiments, contact pad 330 is formed using a dual damascene technique. In some embodiments, contact pad 330 has a thickness ranging from about 1000 nm to about 3000 nm. A greater thickness increases a manufacturing cost without a significant improvement in production yield, in some instances. A smaller thickness increases a risk of being damaged during a wire bonding process, in some instances. In some embodiments, a spacing S30 between adjacent contact pads 130 is equal to or greater than 500 nm. A smaller spacing increases a difficulty of a subsequent filling process, in some instances. In some embodiments, a portion of first passivation layer 320 is exposed and the exposed portion is removed during the formation of contact pads 330. As a result, the top surface of the exposed portion of first passivation layer 320 is below a bottom surface of contact pad 330.

FIG. 3B is a cross-sectional view of semiconductor device 300 following operation 220 in accordance with some embodiments. A first insulating film 342 is continuously and conformally along the top surface of first passivation layer, and sidewalls and the top surface of contact pad 330. In some embodiments, first insulating film 342 has a thickness ranging from about 50 nm to about 300 nm. A greater thickness increases a possibility of generating voids between adjacent contact pads 130, in some instances. A smaller thickness provides insufficient protection to contact pads 130, in some instances. In some embodiments, a bottom portion of first insulating film 342, which is in direct contact with first passivation layer 320, is below the bottom surface of contact pad 330.

FIG. 3C is a cross-sectional view of semiconductor device 300 following operation 230 in accordance with some embodiments. A second insulating film 344 is continuously and conformally along first insulating film 342. In some embodiments, second insulating film 344 has a uniform thickness ranging from about 20 nm to about 80 nm. A greater thickness increases a possibility of generating voids between adjacent contact pads 130, in some instances. A smaller thickness increases a risk of atom diffusion during a subsequent process, in some instances. In particular, second insulating film 344 includes a first portion 344a close to and substantially parallel to first passivation layer 320, a second portion 344b over the top surface of contact pad 330 and substantially parallel to first portion 344a, and a third portion 344c along the sidewalls of contact pads 330. In some embodiments, an entirety of first portion 344a is below the bottom surface of contact pad 330.

FIG. 3D is a cross-sectional view of semiconductor device 300 following operation 240 in accordance with some embodiments. A third insulating film 346 is continuously over first insulating film 342. In some embodiments, third insulating film 346 has a thickness ranging from about 500 nm to about 1500 nm. A greater thickness increases a possibility of generating voids between adjacent contact pads 330, in some instances. An angle between a sidewall portion and a bottom portion of third insulating film 346 is greater than 95 degrees. In some embodiments, a spacing S32 between adjacent sidewall portions of third insulating film 346 is equal to or greater than 250 nm. Because third portion 344c is removed during the formation of third insulating film 346, second insulating film 344 becomes discontinuous over first insulating film 342. As a result, a topmost portion and a bottommost portion of third insulating film 346 is in contact with second insulating film 344, and a sidewall portion of third insulating film 346 is in direct contact with first insulating film 342. In some embodiments, the bottommost portion of third insulating film 346 is below the bottom surface of contact pad 330.

Figure 4:
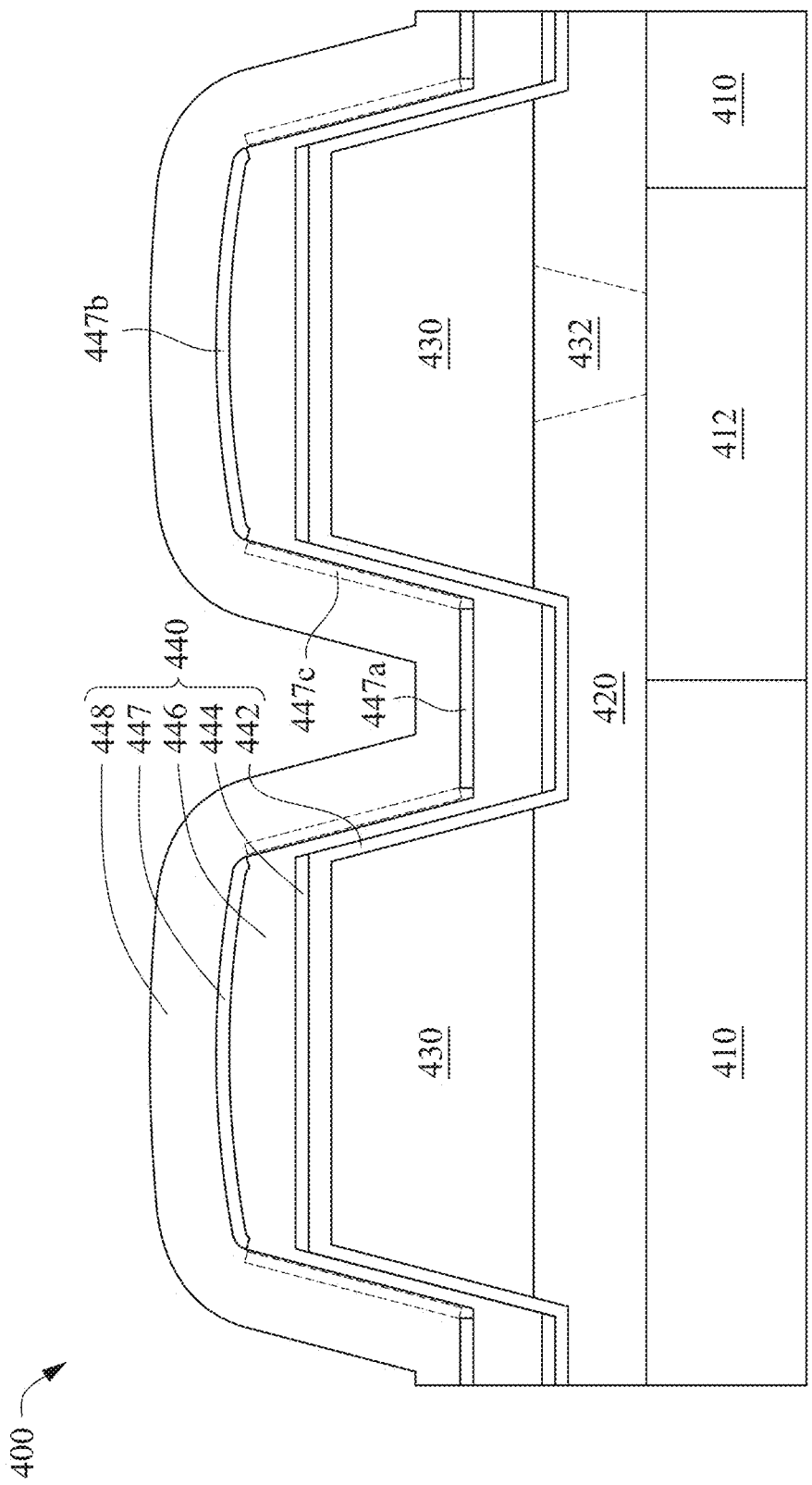
FIG. 4 is a cross-sectional view of a semiconductor device in accordance with one or more embodiments.

FIG. 4 is a cross-sectional view of a semiconductor device 400 in accordance with one or more embodiments. Semiconductor device 400 includes elements similar to semiconductor device 100 and a last two digits of like elements are the same. In comparison with semiconductor device 100 in FIG. 1, semiconductor device 400 further includes a fifth insulating film 447 between a third insulating film 446 and a fourth insulating film 448. In order to maintain a profile similar to semiconductor device 100, a thickness of third insulating film 446 is reduced by about 100 nm in comparison with third insulating film 146 in FIG. 1. After the deposition of third insulating film 446, fifth insulating film 447 is continuously and conformally deposited over third insulating film 446. Fifth insulating film 447 has a curved shape with respect to a cross-sectional view. In some embodiments, fifth insulating film 447 is deposited using a same method as that used for second insulating film 444. In some embodiments, fifth insulating film 447 is deposited using a different method from that used for second insulating film 444. For example, in some embodiments, second insulating film 444 is deposited using HDPCVD and fifth insulating film is deposited using PECVD. In some embodiments, fifth insulating film has a thickness ranging from about 20 nm to about 80 nm. A greater thickness increases a possibility of generating voids between adjacent contact pads 430, in some instances. A smaller thickness increases a risk of atom diffusion during a subsequent process, in some instances. Next, fourth insulating film 448 is deposited over fifth insulating film 447. In some embodiments, fourth insulating film 448 is deposited using a same method as that used for fifth insulating film 447. However, even though fourth insulating film 448 and fifth insulating film 447 are deposited at a same chamber, an interface exists between the two films with respect to a cross-sectional view. In some embodiments, fourth insulating film 448 is deposited using a different method from that used for fifth insulating film 447. For example, fourth insulating film 448 is deposited using PECVD and fifth insulating film is deposited using HDPCVD. In at least one embodiment, in comparison with semiconductor device 100 in FIG. 1, a thickness of fourth insulating film 448 is thinner than a thickness of fourth insulating film 148. As a result, because a top surface of third insulating film 446 is substantially planar, fifth insulating film 447 is over third insulating film 446 in a planar manner as well.

An aspect of this description relates to a semiconductor structure. The semiconductor structure includes a conductive structure over a first passivation layer. The semiconductor structure further includes a second passivation layer over the conductive structure and the first passivation layer. The second passivation layer has a first oxide film extending along a top surface of the first passivation layer, sidewalls and a top surface of the conductive structure. The second passivation layer further includes a second oxide film over a top surface of the first oxide film and a top surface of the conductive structure. The second passivation layer further includes a third oxide film extending along a top surface of the second oxide film, the sidewalls and the top surface of the conductive structure. In some embodiments, a sidewall portion of the first oxide film is in direct contact with a sidewall portion of the third oxide film. In some embodiments, a ratio of a thickness of the second passivation layer over the first passivation layer to a thickness of the conductive structure is in a range from about 0.5 to about 1. In some embodiments, a ratio of a spacing to a thickness of the second passivation layer over the first passivation layer is in a range from about 0.7 to about 1.3, wherein the spacing is between the conductive structure and an adjacent conductive structure. In some embodiments, the semiconductor structure further includes a silicon nitride film over the third oxide film, wherein an angle between a sidewall portion and a bottom portion of the silicon nitride film is greater than 95 degrees. In some embodiments, the second passivation layer further includes a silicon nitride film over the third oxide film, wherein a bottom-up ratio of the silicon nitride film is in a range from about 0.75 to about 1.1. In some embodiments, the second oxide film and the third oxide film have a Fourier transform infrared spectroscopy (FTIR) absorption band ranging from about 2500 nanometers (nm) to about 2900 nm. In some embodiments, the second oxide film has a thickness from about 20 nm to about 100 nm.

An aspect of this description relates to a semiconductor structure. The semiconductor structure includes a conductive structure over a first passivation layer; and a second passivation layer over the conductive structure and the first passivation layer. The second passivation layer has a first oxide film extending along a top surface of the first passivation layer, sidewalls and a top surface of the conductive structure, wherein a top surface of the first oxide film is planar. The second passivation layer further includes a second oxide film over a top surface of the first oxide film and a top surface of the conductive structure, wherein a top surface of the second oxide film is planar. The second passivation layer further includes a third oxide film extending along a top surface of the second oxide film, the sidewalls and the top surface of the conductive structure, wherein a top surface of the third oxide film is curved. In some embodiments, the semiconductor structure further includes a second conductive structure over the first passivation layer, wherein the second conductive structure is spaced from the conductive structure in a direction parallel to a top surface of the first passivation layer. In some embodiments, the first oxide film is a continuous film extending over the second conductive structure. In some embodiments, the second oxide film is a discontinuous film extending over the second conductive structure. In some embodiments, the third oxide film is a continuous film extending over the second conductive structure. In some embodiments, the semiconductor structure further includes a via extending through the first passivation layer, wherein the conductive structure is electrically connected to the via. In some embodiments, an entirety of a bottommost surface of the conductive structure contacts the first passivation layer. In some embodiments, the semiconductor structure further includes a guard seal ring structure, wherein the conductive structure is over the guard seal ring structure.

An aspect of this description relates to a method of fabricating a semiconductor structure. The method includes depositing a first dielectric film continuously over a conductive structure. The method further includes depositing a second dielectric film continuously over the first dielectric film. The method further includes depositing a third dielectric film over the second dielectric film, wherein depositing the third dielectric film includes simultaneously removing a portion of the second dielectric film, and a portion of the third dielectric film is in direct contact with a portion of the first dielectric film. In some embodiments, the third dielectric film includes removing the portion of the second dielectric film over a sidewall of the conductive structure. In some embodiments, depositing the third dielectric film includes maintaining the second dielectric film over a top-most surface of the conductive structure. In some embodiments, depositing the third dielectric film includes depositing the third dielectric film to form a curved top surface of the third dielectric film. In some embodiments, depositing the third dielectric film includes depositing the third dielectric film having a bottommost surface below a bottommost surface of the conductive structure. In some embodiments, depositing the third dielectric film includes depositing the third dielectric film having a first thickness of a top-most surface of the conductive structure and having a second thickness along a sidewall of the conductive structure, wherein the first thickness is greater than the second thickness.

An aspect of this description relates to a semiconductor device. The semiconductor device includes a conductive structure over a first passivation layer. The semiconductor device further includes a first insulating film over the conductive structure, wherein the first insulating film has a first Si:X ratio, where X is another material in the first insulating film, and the first insulating film is a continuous layer. The semiconductor device further includes a second insulating film over the first insulating film, wherein the second insulating film has a smaller Si:X ratio than the first insulating film, and the second insulating film is a discontinuous layer. The semiconductor device further includes a third insulating film over the second insulating film, wherein the third insulating film is between adjacent portions of the second insulating film. In some embodiments, X comprises oxygen. In some embodiments, the third insulating film has a third Si:X ratio greater than the Si:X ratio of the second insulating film. In some embodiments, the third Si:X ratio is equal to the first Si:X ratio. In some embodiments, the adjacent portions of the second insulating film include a first portion over a top-most surface of the conductive structure; and a second portion over a region of the first passivation layer beyond a periphery of the conductive structure. In some embodiments, the adjacent portions of the second insulating film include a first portion entirely over a top-most surface of the conductive structure; and a second portion entirely below a bottommost surface of the conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a conductive structure over a first passivation layer; and
   a second passivation layer over the conductive structure and the first passivation layer, wherein the second passivation layer has:
      a first oxide film extending along a top surface of the first passivation layer, sidewalls and a top surface of the conductive structure, wherein a top surface of the first oxide film is planar,
      a second oxide film over a top surface of the first oxide film and a top surface of the conductive structure, wherein a top surface of the second oxide film is planar,
      a third oxide film extending along a top surface of the second oxide film, the sidewalls and the top surface of the conductive structure, wherein a top surface of the third oxide film is curved, and
      a fourth insulating film extending along a top surface of the third oxide film.

2. The semiconductor structure of claim 1, further comprising a second conductive structure over the first passivation layer, wherein the second conductive structure is spaced from the conductive structure in a direction parallel to a top surface of the first passivation layer.

3. The semiconductor structure of claim 2, wherein the first oxide film is a continuous film extending over the second conductive structure.

4. The semiconductor structure of claim 2, wherein the second oxide film is a discontinuous film extending over the second conductive structure.

5. The semiconductor structure of claim 2, wherein the third oxide film is a continuous film extending over the second conductive structure.

6. The semiconductor structure of claim 1, further comprising a via extending through the first passivation layer, wherein the conductive structure is electrically connected to the via.

7. The semiconductor structure of claim 1, wherein an entirety of a bottommost surface of the conductive structure contacts the first passivation layer.

8. The semiconductor structure of claim 1, further comprising a guard seal ring structure, wherein the conductive structure is over the guard seal ring structure.

9. A method of fabricating a semiconductor structure, the method comprising:
   depositing a first dielectric film continuously over a conductive structure;
   depositing a second dielectric film continuously over the first dielectric film; and
   depositing a third dielectric film over the second dielectric film, wherein depositing the third dielectric film comprises simultaneously removing a portion of the second dielectric film, and a portion of the third dielectric film is in direct contact with a portion of the first dielectric film.

10. The method of claim 9, wherein depositing the third dielectric film comprises removing the portion of the second dielectric film over a sidewall of the conductive structure.

11. The method of claim 9, wherein depositing the third dielectric film comprises maintaining the second dielectric film over a top-most surface of the conductive structure.

12. The method of claim 9, wherein depositing the third dielectric film comprises depositing the third dielectric film to form a curved top surface of the third dielectric film.

13. The method of claim 9, wherein depositing the third dielectric film comprises depositing the third dielectric film having a bottommost surface below a bottommost surface of the conductive structure.

14. The method of claim 9, wherein depositing the third dielectric film comprises depositing the third dielectric film having a first thickness of a top-most surface of the conductive structure and having a second thickness along a sidewall of the conductive structure, wherein the first thickness is greater than the second thickness.

15. A semiconductor device comprising:
   a conductive structure over a first passivation layer;
   a first insulating film over the conductive structure, wherein the first insulating film has a first Si:X ratio, where X is another material in the first insulating film, and the first insulating film is a continuous layer;
   a second insulating film over the first insulating film, wherein the second insulating film has a smaller Si:X ratio than the first insulating film, and the second insulating film is a discontinuous layer;
   a third insulating film over the second insulating film, wherein the third insulating film is between adjacent portions of the second insulating film.

16. The semiconductor device of claim 15, wherein X comprises oxygen.

17. The semiconductor device of claim 15, wherein the third insulating film has a third Si:X ratio greater than the Si:X ratio of the second insulating film.

18. The semiconductor device of claim 17, wherein the third Si:X ratio is equal to the first Si:X ratio.

19. The semiconductor device of claim 15, wherein the adjacent portions of the second insulating film comprise:
   a first portion over a top-most surface of the conductive structure; and
   a second portion over a region of the first passivation layer beyond a periphery of the conductive structure.

20. The semiconductor device of claim 15, wherein the adjacent portions of the second insulating film comprise:
- a first portion entirely over a top-most surface of the conductive structure; and
- a second portion entirely below a bottommost surface of the conductive structure.

* * * * *